US009906312B2

(12) United States Patent
Kim

(10) Patent No.: US 9,906,312 B2
(45) Date of Patent: Feb. 27, 2018

(54) SEMICONDUCTOR PACKAGES WITH OPTICAL INTERCONNECTION STRUCTURES, MEMORY CARDS INCLUDING THE SAME, AND ELECTRONIC SYSTEMS INCLUDING THE SAME

(71) Applicant: SK hynix Inc., Icheon-si, Gyeonggi-do (KR)

(72) Inventor: Jong Hoon Kim, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 1 day.

(21) Appl. No.: 14/704,174

(22) Filed: May 5, 2015

(65) Prior Publication Data

US 2016/0142155 A1 May 19, 2016

(30) Foreign Application Priority Data

Nov. 17, 2014 (KR) ........................ 10-2014-0160277

(51) Int. Cl.
*H04B 10/40* (2013.01)
*H04B 10/80* (2013.01)

(52) U.S. Cl.
CPC ........... *H04B 10/803* (2013.01); *H04B 10/40* (2013.01); *H01L 2224/16225* (2013.01); *H01L 2924/15311* (2013.01)

(58) Field of Classification Search
CPC ....... H01L 2224/48227; H01L 2924/00; H01L 2224/73265; H01L 2924/00012; H01L 2224/32225
See application file for complete search history.

(56) References Cited

U.S. PATENT DOCUMENTS

| 2004/0208593 A1* | 10/2004 | Bloom ................. H04B 10/112 398/118 |
| 2008/0180389 A1* | 7/2008 | Kelly ................... H04B 10/803 345/156 |
| 2013/0320359 A1 | 12/2013 | Hummler |
| 2015/0010269 A1* | 1/2015 | Jo ............................ G02B 6/43 385/14 |
| 2015/0115999 A1* | 4/2015 | Lee ................ H03K 19/017545 326/30 |

FOREIGN PATENT DOCUMENTS

KR 1020110135145 A 12/2011

\* cited by examiner

*Primary Examiner* — Tony Tran
(74) *Attorney, Agent, or Firm* — William Park & Associates Ltd.

(57) ABSTRACT

A semiconductor package includes a first transceiver disposed on a top surface of a substrate; and a second transceiver disposed on a bottom surface of the substrate. The first and second transceivers optically communicate with each other through optical signals that permeate the substrate.

17 Claims, 11 Drawing Sheets

SEMICONDUCTOR PACKAGES WITH OPTICAL INTERCONNECTION STRUCTURES, MEMORY CARDS INCLUDING THE SAME, AND ELECTRONIC SYSTEMS INCLUDING THE SAME

CROSS-REFERENCE TO RELATED APPLICATION

The present application claims priority under 35 U.S.C 119(a) to Korean Application No. 10-2014-0160277, filed on Nov. 17, 2014, in the Korean intellectual property Office, which is incorporated herein by reference in its entirety.

BACKGROUND

1. Technical Field

Embodiments of the invention relate to semiconductor packages and, more particularly, to semiconductor packages with optical interconnection structures, memory cards including the same, and electronic systems including the same.

2. Related Art

Semiconductor packages which are capable of processing a large amount of data are increasingly in demand with the development of smaller electronic systems such as mobile systems. In response to such a demand, it may be necessary to increase the integration density of semiconductor devices used in the electronic systems. However, there may be some limitations in increasing the integration density of the semiconductor devices. Recently, three dimensional semiconductor devices including vertical transistors instead of planar transistors have been proposed to increase the integration density of the semiconductor devices. Nevertheless, there may be a lot of technical difficulties in developing the three dimensional semiconductor devices.

Stack packages including a plurality of stacked semiconductor devices (also, referred to as semiconductor chips or semiconductor dice) have been proposed to process a large amount of data. Each of the stack packages may be fabricated by stacking a plurality of semiconductor chips on a single package substrate and by encapsulating the stacked semiconductor chips. That is, high capacitive semiconductor packages may be fabricated in a stack package form. In such a case, the number of signal paths (i.e., signal lines) for driving the semiconductor chips may increase in proportion of the number of the stacked semiconductor chips. Accordingly, it may be necessary to reduce a line width and a pitch of metal interconnection lines (corresponding to the signal paths) disposed on and in the package substrate in order to realize the high capacitive stacked packages.

SUMMARY

According to an embodiment, a semiconductor package includes a semiconductor chip disposed on a top surface of an interposer. The semiconductor package also includes a first driver chip and a second driver chip disposed on the top surface and a bottom surface of the interposer respectively. The semiconductor package also includes a first optical transmitter and a first optical receiver mounted on a surface of the first driver chip and controlled by the first driver chip. Further, the semiconductor package includes a second optical transmitter and a second optical receiver mounted on a surface of the second driver chip and controlled by the second driver chip. The second optical transmitter and the second optical receiver optically communicate with the first optical transmitter and the first optical receiver through optical signals that permeate the interposer.

According to an embodiment, a semiconductor package includes an interposer, a first driver chip and a second driver chip respectively disposed on a top surface and a bottom surface of the interposer, a first semiconductor chip disposed on the top surface of the interposer and electrically coupled to the first driver chip, a second semiconductor chip disposed on the bottom surface of the interposer and electrically coupled to the second driver chip, first conductive interconnection lines for electrically coupling the first semiconductor chip to the first driver chip, third conductive interconnection lines for electrically coupling the second semiconductor chip to the second driver chip, a first optical transmitter and a first optical receiver mounted on a surface of the first driver chip and controlled by the first driver chip, a second optical transmitter and a second optical receiver mounted on a surface of the second driver chip and controlled by the second driver chip, a signal terminal disposed on the bottom surface of the interposer, and a second conductive interconnection line for electrically coupling the second driver chip to the signal terminal. The second optical transmitter and the second optical receiver optically communicate with the first optical transmitter and the first optical receiver through optical signals permeating the interposer.

According to an embodiment, a semiconductor package includes a first driver chip and a second driver chip disposed on a top surface and a bottom surface of the interposer respectively. The semiconductor package may also include a first semiconductor chip disposed on the top surface of the interposer and electrically coupled to the first driver chip. The semiconductor package may also include a second semiconductor chip disposed on the top surface of the interposer and spaced apart from the first semiconductor chip. The semiconductor package may also include first conductive interconnection lines for electrically coupling the first semiconductor chip to the first driver chip. Further, the semiconductor package may include a first optical transmitter and a first optical receiver mounted on a surface of the first driver chip and controlled by the first driver chip. The semiconductor package may also include a second optical transmitter and a second optical receiver mounted on a surface of the second driver chip and controlled by the second driver chip. The semiconductor package may include signal terminals disposed on the bottom surface of the interposer. The semiconductor package may include a second conductive interconnection line for electrically coupling the second driver chip to one of the signal terminals. Further, the semiconductor package may include a third through via penetrating the interposer to electrically couple the second semiconductor chip to another one of the signal terminals. The second optical transmitter and the second optical receiver optically communicate with the first optical transmitter and the first optical receiver through optical signals permeating the interposer.

According to an embodiment, a semiconductor package includes a first transceiver disposed on a top surface of a substrate. The semiconductor package also includes a second transceiver disposed on a bottom surface of the substrate. The first and second transceivers optically communicate with each other through optical signals that permeate the substrate.

According to an embodiment, a memory card comprises a package. The package includes a semiconductor chip disposed on a top surface of an interposer. The package also includes a first driver chip and a second driver chip disposed on the top surface and a bottom surface of the interposer respectively. The package also includes a first optical transmitter and a first optical receiver mounted on a surface of the first driver chip and controlled by the first driver chip. Further, the package includes a second optical transmitter and a second optical receiver mounted on a surface of the second driver chip and controlled by the second driver chip. The second optical transmitter and the second optical receiver optically communicate with the first optical transmitter and the first optical receiver through optical signals permeating the interposer.

According to an embodiment, a memory card comprises a package. The package includes a first driver chip and a second driver chip disposed on a top surface and a bottom surface of the interposer respectively. The package also includes a first semiconductor chip disposed on the top surface of the interposer and electrically coupled to the first driver chip. The package also includes a second semiconductor chip disposed on the bottom surface of the interposer and electrically coupled to the second driver chip. The package also includes first conductive interconnection lines for electrically coupling the first semiconductor chip to the first driver chip. The package also includes third conductive interconnection lines for electrically coupling the second semiconductor chip to the second driver chip. The package also includes a first optical transmitter and a first optical receiver mounted on a surface of the first driver chip and controlled by the first driver chip. The package also includes a second optical transmitter and a second optical receiver mounted on a surface of the second driver chip and controlled by the second driver chip. The package also includes a signal terminal disposed on the bottom surface of the interposer. Further, the package also includes a second conductive interconnection line for electrically coupling the second driver chip to the signal terminal. The second optical transmitter and the second optical receiver optically communicate with the first optical transmitter and the first optical receiver through optical signals permeating the interposer.

According to an embodiment, a memory card comprises a package. The package includes a first driver chip and a second driver chip disposed on a top surface and a bottom surface of the interposer respectively. The package also includes a first semiconductor chip disposed on the top surface of the interposer and electrically coupled to the first driver chip. The package also includes a second semiconductor chip disposed on the top surface of the interposer and spaced apart from the first semiconductor chip. The package also includes first conductive interconnection lines for electrically coupling the first semiconductor chip to the first driver chip. In addition, the package also includes a first optical transmitter and a first optical receiver mounted on a surface of the first driver chip and controlled by the first driver chip. The package also includes a second optical transmitter and a second optical receiver mounted on a surface of the second driver chip and controlled by the second driver chip. The package also includes signal terminals disposed on the bottom surface of the interposer. The package also includes a second conductive interconnection line for electrically coupling the second driver chip to one of the signal terminals. The package also includes a through via penetrating the interposer to electrically couple the second semiconductor chip to another one of the signal terminals. The second optical transmitter and the second optical receiver optically communicate with the first optical transmitter and the first optical receiver through optical signals permeating the interposer.

According to an embodiment, a memory card comprises a package. The package includes a first transceiver disposed on a top surface and a second transceiver disposed on a bottom surface of a substrate respectively. The first and second transceivers optically communicate with each other through optical signals that permeate the substrate.

According to an embodiment, an electronic system comprises a package. The package includes a semiconductor chip disposed on a top surface of an interposer. The package also includes a first driver chip and a second driver chip disposed on the top surface and a bottom surface of the interposer respectively. The package also includes a first optical transmitter and a first optical receiver mounted on a surface of the first driver chip and controlled by the first driver chip. The package also includes a second optical transmitter and a second optical receiver mounted on a surface of the second driver chip and controlled by the second driver chip. The second optical transmitter and the second optical receiver optically communicate with the first optical transmitter and the first optical receiver through optical signals permeating the interposer.

According to an embodiment, an electronic system comprises a package. The package includes a first driver chip and a second driver chip disposed on a top surface and a bottom surface of an interposer respectively. The package also includes a first semiconductor chip disposed on the top surface of the interposer and electrically coupled to the first driver chip. The package also includes a second semiconductor chip disposed on the bottom surface of the interposer and electrically coupled to the second driver chip. The package also includes first conductive interconnection lines for electrically coupling the first semiconductor chip to the first driver chip. The package also includes third conductive interconnection lines for electrically coupling the second semiconductor chip to the second driver chip. The package also includes a first optical transmitter and a first optical receiver mounted on a surface of the first driver chip and controlled by the first driver chip. The package also includes a second optical transmitter and a second optical receiver mounted on a surface of the second driver chip and controlled by the second driver chip. The package also includes a signal terminal disposed on the bottom surface of the interposer. Further, the package includes a second conductive interconnection line for electrically coupling the second driver chip to the signal terminal. The second optical transmitter and the second optical receiver optically communicate with the first optical transmitter and the first optical receiver through optical signals permeating the interposer.

According to an embodiment, an electronic system comprises a package. The package includes a first driver chip and a second driver chip disposed on a top surface and a bottom surface of an interposer respectively. The package also includes a first semiconductor chip disposed on the top surface of the interposer and electrically coupled to the first driver chip. The package also includes a second semiconductor chip disposed on the top surface of the interposer and spaced apart from the first semiconductor chip. The package also includes first conductive interconnection lines for electrically coupling the first semiconductor chip to the first driver chip. The package also includes a first optical transmitter and a first optical receiver mounted on a surface of the first driver chip and controlled by the first driver chip. The package also includes a second optical transmitter and a second optical receiver mounted on a surface of the second driver chip and controlled by the second driver chip. The package also includes signal terminals disposed on the bottom surface of the interposer. The package also includes a second conductive interconnection line for electrically coupling the second driver chip to one of the signal terminals. The package also includes and a through via penetrating the interposer to electrically couple the second semiconductor chip to another one of the signal terminals. The second optical transmitter and the second optical receiver optically communicate with the first optical transmitter and the first optical receiver through optical signals permeating the interposer.

According to an embodiment, an electronic system comprises a package. The package includes a substrate. The package also includes a first transceiver disposed on a top surface of the substrate. The package also includes and a second transceiver disposed on a bottom surface of the substrate. The first and second transceivers optically communicate with each other through optical signals that permeate the substrate.

DETAILED DESCRIPTION

Figure 1:
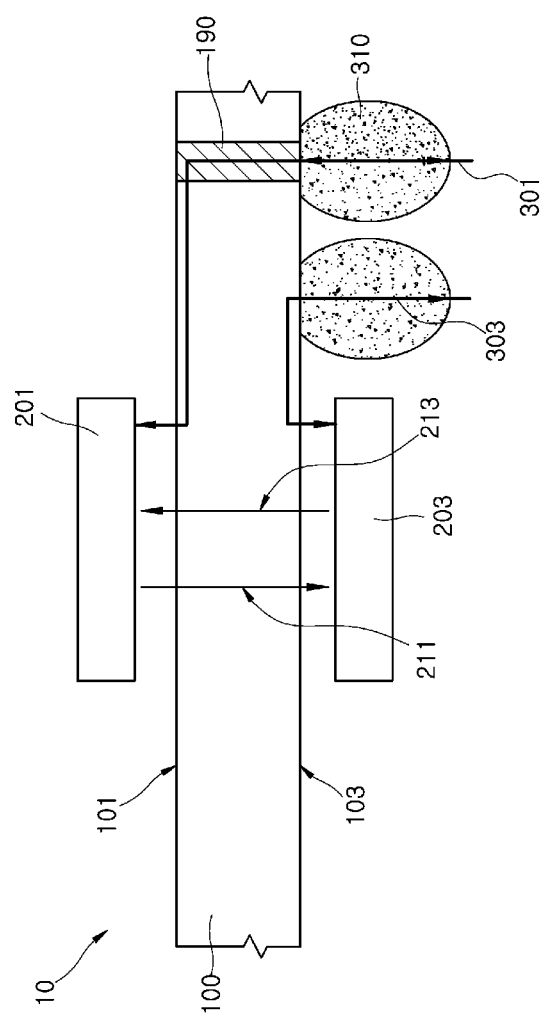
FIG. 1 is a cross-sectional view illustrating a semiconductor package according to an embodiment.

It will be understood that although the terms first, second, third etc. may be used herein to describe various elements, these elements should not be limited by these terms. These terms are only used to distinguish one element from another element within the detailed description. Thus, a first element in some embodiments could be termed a second element in other embodiments without departing from the teachings of the inventive concept. Moreover, various embodiments are directed to semiconductor packages with optical interconnection structures, memory cards including the same, and electronic systems including the same.

It will also be understood that when an element is referred to as being "on," "above," "below," or "under" another element, it can be directly "on," "above," "below," "under," "in," or "inside" the other element, respectively. In the alternative, intervening elements may also be present. Accordingly, the terms such as "on," "above," "below," "under," in," or "inside" which are used herein are for the purpose of describing particular embodiments only and are not intended to limit the inventive concept.

It will be further understood that when an element is referred to as being "connected" or "coupled" to another element, it can be directly connected or electrically coupled to the other element or intervening elements may be present. In contrast, when an element is referred to as being "directly connected" or "directly electrically coupled" to another element, there are no intervening elements present. Other words used to describe the relationship between elements or layers should be interpreted in a like or similar fashion. Semiconductor chips may be obtained by separating a semiconductor substrate such as a wafer into a plurality of pieces using a die sawing process.

If a plurality of semiconductor chips (i.e., such as a semiconductor dice) are stacked on a package substrate to form a semiconductor package, through electrodes (or through vias) such as through silicon vias (TSVs) may penetrate the semiconductor chips to electrically couple the semiconductor chips. The semiconductor chips may correspond to memory chips or logic chips. The memory chips may include dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PcRAM) circuits integrated on and/or in the semiconductor substrate. The logic chips may include logic circuits integrated on and/or in the semiconductor substrate.

Any one of semiconductor packages according to the following embodiments may be a system-in-package (SIP) that includes a plurality of semiconductor chips, functions of which are different from each other. The plurality of semiconductor chips may be mounted on an interposer. In addition, the interposer may be electrically coupled to a package substrate. In semiconductor packages known as 2.5-dimensional SIPs, a plurality of semiconductor chips may be mounted on a silicon interposer and the plurality of semiconductor chips may be electrically couple to each other through a plurality of conductive interconnection lines disposed on the silicon interposer.

The silicon interposers may be fabricated using semiconductor processes. More specifically, the silicon interposers may be fabricated by applying the semiconductor processes to a silicon wafer. Thus, the conductive interconnection lines disposed on the silicon interposer may be formed to have a fine line width which is equal to or less than a submicron. In addition, through vias such as TSVs may penetrate the silicon interposer to electrically couple front-side interconnection lines disposed on a top surface of the silicon interposer to backside interconnection lines disposed on a bottom surface of the silicon interposer. The silicon interposers may be fabricated to include interconnection lines having a fine width in comparison to printed circuit boards (PCBs) used as general package substrates. However, the number of the interconnection lines (e.g., metal interconnection lines) disposed on the interposer has been increasing as design schemes and process technologies of the semiconductor chips become developed. Accordingly, it may be difficult to realize desired signal integrity using only technologies for electrically coupling the interconnection lines.

According to the following embodiments, an optical interconnection structure may optically connect an upper semiconductor chip disposed on a top surface of a silicon interposer to a lower semiconductor chip disposed on a bottom surface of the silicon interposer, which thereby provides a semiconductor package in which signals are optically transmitted and/or received. As a result, signal transmission speed in the semiconductor package may be improved to provide a high performance package. Moreover, because the semiconductor chips of the semiconductor package optically communicate with each other, the number of the interconnection lines for transmitting electrical signals may be reduced.

Referring to FIG. 1, a cross-sectional view illustrating a semiconductor package 10 according to an embodiment is illustrated.

In FIG. 1, the semiconductor package 10 may include a first transceiver 201 disposed on a top surface 101 of a substrate 100 and a second transceiver 203 disposed on a bottom surface 103 of the substrate 100. The substrate 100 may be a silicon interposer. Each of the first and second transceivers 201 and 203 may be a photonic device that converts electrical signals into optical signals to transmit the optical signals. The first and second transceivers 201 and 203 also receive signals including optical signals to convert the optical signals into electrical signals.

Each of the first and second transceivers 201 and 203 may include an optical transmitter, an optical receiver and a driver. The optical transmitter may include a light generating element, for example, a light emitting diode (LED), a laser diode, a vertical cavity surface emitting laser (VCSEL), a Fabry-Perot (FP) laser or a distributed feedback (DFB) laser. The optical receiver may include a photo detector that receives light to generate current. For example, the optical receiver may include a photo diode or an avalanche photo diode. The driver may drive the optical transmitter and the optical receiver. The optical transmitter, the optical receiver and the driver may be integrated in a single monolithic chip.

In various embodiments, each of the first and second transceivers 201 and 203 may be configured in a multi-chip form. More specifically, the optical transmitter and the optical receiver may be mounted on a driver chip that drives the optical transmitter and the optical receiver.

The first and second transceivers 201 and 203 may be respectively disposed on both surfaces a portion of the substrate 100 to face each other. For instance, the first and second transceivers 201 and 203 may be disposed to overlap with a portion of the substrate 100 therebetween. Accordingly, the first and second transceivers 201 and 203 may directly and optically communicate with each other without aid of any other optical guide such as an optical fiber. A first optical signal 211 generated from the first transceiver 201 may travel toward the top surface 101 of the substrate 100. The first optical signal 211 may penetrate the substrate 100 to reach the second transceiver 203 facing the bottom surface 103 of the substrate 100.

A second optical signal 213 generated from the second transceiver 203 may travel toward the bottom surface 103 of the substrate 100. Further, the second optical signal 213 may penetrate the substrate 100 to reach the first transceiver 201 facing the top surface 101 of the substrate 100. As such, the first and second transceivers 201 and 203 may be disposed on the substrate 100 to directly perform optical communication each other even without use of any optical guides or optical paths. As a result, the optical connection structure may be relatively simple. In addition, a travel length of the optical signals may be reduced to improve the speed of the optical communication. Connection members 310 may be attached to the bottom surface 103 of the substrate 100. One of the connection members 310 may act as a power supply terminal to supply a power supply voltage to the first and second transceivers 201 and 203. Further, another one of the connection members 310 may act as a signal terminal to output electrical signals generated from the first or second transceiver 201 or 203 to an external device and for receiving external electrical signals and transmitting the external electrical signals to the first or second transceiver 201 or 203. The connection members 310 may be bumps, for example, C4 bumps. The second transceiver 203 disposed on the bottom surface 103 of the substrate 100 may receive the power supply voltage or may receive and output data signals through a first electrical path 303. The first electrical path 303 may include any one of the second connection members 310 and a conductive interconnection line disposed on the bottom surface 103 of the substrate 100.

The first transceiver 201 disposed on the top surface 101 of the substrate 100 may be electrically coupled to one of the second connection members 310 through a second electrical path 301. The second electrical path 301 may include a through via 190 such as a TSV substantially penetrating the substrate 100 and a conductive interconnection line disposed on the top surface 101 of the substrate 100. The first transceiver 201 may receive a power supply voltage through the second electrical path 301. Although not shown in FIG. 1, other semiconductor chips may be mounted on the top surface 101 and the bottom surface 103 of the substrate 100 accordingly. A semiconductor chip disposed on the top surface 101 of the substrate 100 may be electrically couple to the first transceiver 201. In addition, a semiconductor chip disposed on the bottom surface 103 of the substrate 100 may be electrically coupled to the second transceiver 203. Thus, the semiconductor chips may receive or output electrical signals through the first or second transceiver 201 or 203.

Signals generated from the semiconductor chips may be transmitted to the connection members 310 using the optical communication between the first and second transceivers 201 and 203. In addition, external signals may be transmitted to the semiconductor chips using the optical communication between the first and second transceivers 201 and 203. As a result, the semiconductor package 10 may operate even without any additional interconnection line and/or any additional through via. Accordingly, an electrical connection structure may be realized on the substrate 100 without any complexity.

Figure 2:
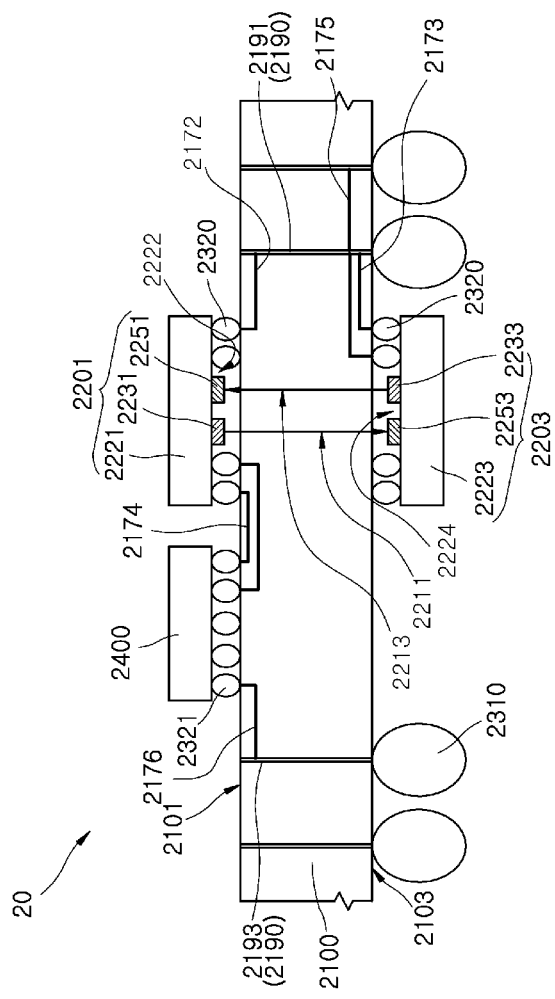
FIG. 2 is a cross-sectional view illustrating a semiconductor package according to an embodiment.
Figure 3:
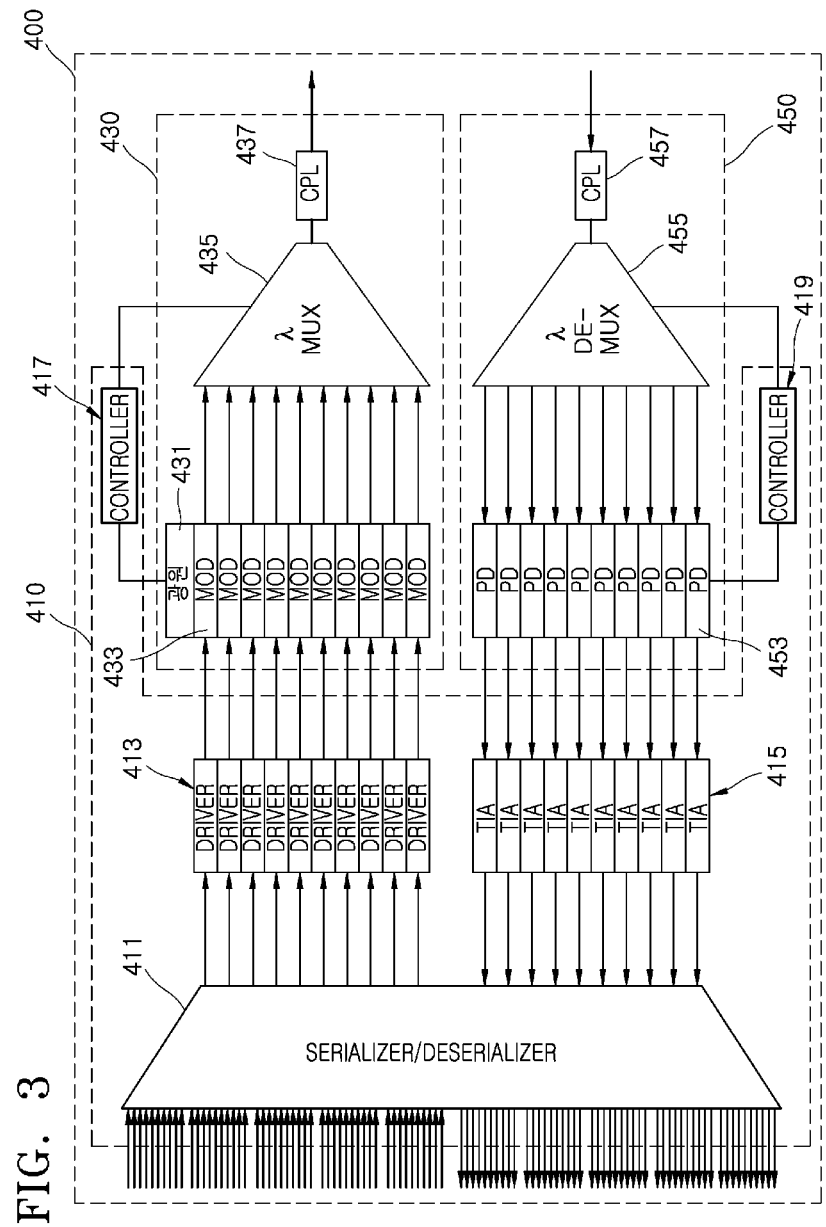
FIG. 3 is a block diagram illustrating an electrical-optical-electrical transceiver included in a semiconductor package according to an embodiment.
Figure 5:
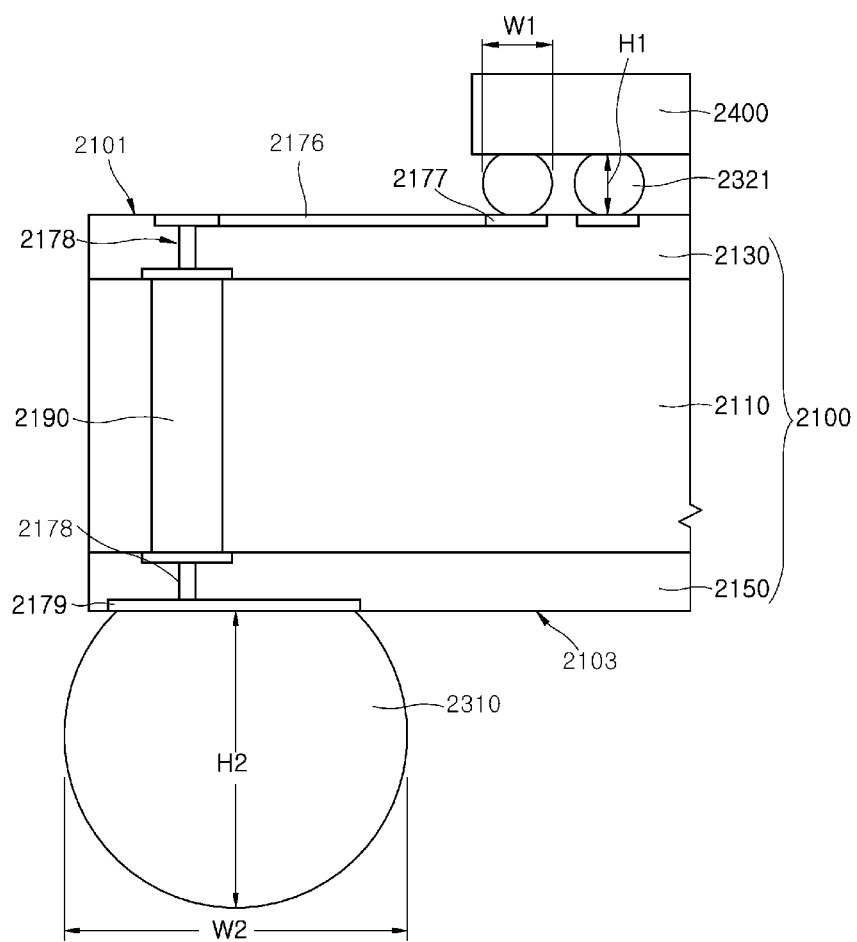
FIG. 5 is a cross-sectional view illustrating an electrical connection between a semiconductor chip and an interposer included in a semiconductor package according to an embodiment.
Figure 6:
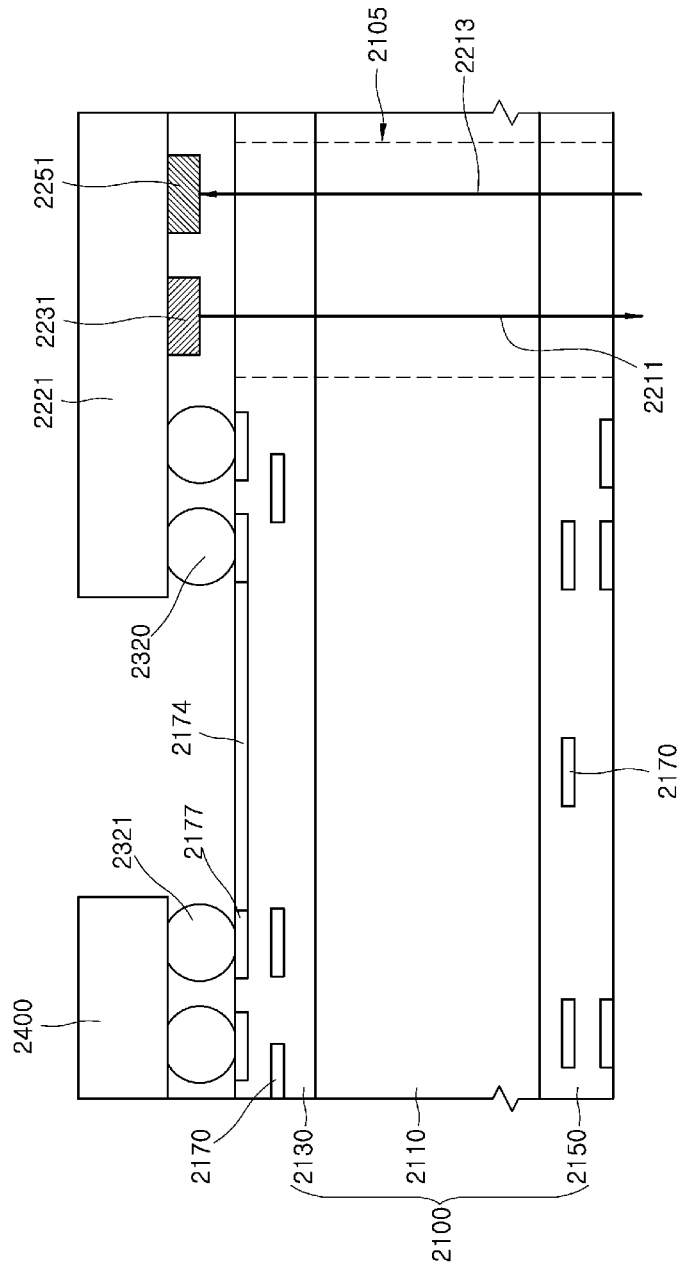
FIG. 6 is a cross-sectional view illustrating an electrical connection between a driver chip and an interposer included in a semiconductor package according to an embodiment.

Referring to FIG. 2, a cross-sectional view illustrating a semiconductor package 20 according to an embodiment is illustrated. Referring to FIG. 3, a block diagram illustrating an electrical-optical-electrical transceiver included in a semiconductor package according to an embodiment is shown. Further, referring to FIG. 4, a plan view illustrating an electrical connection between a semiconductor chip and a driver chip included in a semiconductor package according to an embodiment is shown. Referring to FIG. 5, a cross-sectional view illustrating an electrical connection between a semiconductor chip and an interposer included in a semiconductor package according to an embodiment is shown. Referring to FIG. 6, a cross-sectional view illustrating an electrical connection between a driver chip and an interposer included in a semiconductor package according to an embodiment is shown.

Referring again to FIG. 2, the semiconductor package 20 may include a first transceiver 2201 disposed on a top surface 2101 of an interposer 2100 and a second transceiver 2203 disposed on a bottom surface 2103 of the interposer 2100. The interposer 2100 may be a silicon interposer formed of a silicon wafer. Each of the first and second transceivers 2201 and 2203 may be a photonic device that converts electrical signals into optical signals to transmit the optical signals. The first and second transceivers 2201 and 2203 also receive an optical signal 2211 or 2213 to convert the optical signal 2211 or 2213 into an electrical signal.

A first driver chip 2221 may be disposed on the top surface 2101 of the interposer 2100. In addition, a second driver chip 2223 may be disposed on the bottom surface 2103 of the interposer 2100. The first and second driver chips 2221 and 2223 may be attached to the interposer 2100 using first connection members 2320 such as bumps (e.g., micro-bumps). The first and second driver chips 2221 and 2223 may be respectively disposed on both surfaces of a portion of the interposer 2100 to face each other. For example, the first and second driver chips 2221 and 2223 may be disposed to overlap with a portion of the interposer 2100 therebetween. A bottom surface 2222 of the first driver chip 2221 may face the top surface 2101 of the interposer 2100. Moreover, a bottom surface 2224 of the second driver chip 2223 may face the bottom surface 2103 of the interposer 2100.

A first optical transmitter 2231 and a first optical receiver 2251 may be disposed on the bottom surface 2222 of the first driver chip 2221 and may be controlled by the first driver chip 2221. The first optical transmitter 2231 may include a light generating element, for example, a light emitting diode (LED), a laser diode, a vertical cavity surface emitting laser (VCSEL), a Fabry-Perot (FP) laser or a distributed feedback (DFB) laser. The first optical transmitter 2231 may be electrically coupled to the first driver chip 2221. The first optical receiver 2251 may include a photo detector that receives light to generate current. For example, the first optical receiver 2251 may include a photo diode or an avalanche photo diode. The first optical receiver 2251 may also be electrically coupled to the first driver chip 2221.

A second optical transmitter 2233 and a second optical receiver 2253 may be disposed on the bottom surface 2224 of the second driver chip 2223 and may be controlled by the second driver chip 2223. The first optical transmitter 2231, the first optical receiver 2251 and the first driver chip 2221 may constitute the first transceiver 2201. The second optical transmitter 2233, the second optical receiver 2253 and the second driver chip 2223 may constitute the second transceiver 2203. The second optical transmitter 2233 may have substantially the same configuration as the first optical transmitter 2231. In addition, the second optical receiver 2253 may have substantially the same configuration as the first optical receiver 2251.

The second optical receiver 2253 may be disposed to be vertically aligned with the first optical transmitter 2231 so that the first optical signal 2211 generated from the first optical transmitter 2231 penetrates the interposer 2100 to directly travel toward the second optical receiver 2253. The second optical transmitter 2233 may be disposed to be vertically aligned with the first optical receiver 2251 so that the second optical signal 2213 generated from the second optical transmitter 2233 penetrates the interposer 2100 to directly travel toward the first optical receiver 2251. More specifically, the first optical transmitter 2231 and the second optical receiver 2253 may be disposed to face each other. In addition, the second optical transmitter 2233 and the first optical receiver 2251 may be disposed to face each other. Accordingly, travel lengths of the optical signals 2211 and 2213 may be minimized to prevent the light intensity of the optical signals 2211 and 2213 from being lowered by scatter of the optical signals 2211 and 2213. The optical signals 2211 and 2213 directly penetrate the interposer 2100 to reach the optical receivers 2253 and 2251, as described above. In particular, the first and second transceivers 2201 and 2203 may directly and optically communicate with each other even without aid of any other optical guide such as an optical fiber.

A semiconductor chip 2400 may be configured on the top surface 2101 of the interposer 2100 to be spaced apart from the first driver chip 2221. The semiconductor chip 2400 may be a memory chip such as a dynamic random access memory (DRAM) device or a NAND-type flash memory device. In the alternative, the semiconductor chip 2400 may be a non-memory chip, for example, a central processing unit (CPU) chip, a system large-scale integration (LSI) chip, or a field programmable gate array (FPGA) chip. Although FIG. 2 illustrates an example in which the semiconductor chip 2400 is a single semiconductor chip, the invention is not limited thereto. In various embodiments, a plurality of semiconductor chips instead of the semiconductor chip 2400 may be disposed on the interposer 2100. In such a case, the plurality of semiconductor chips may have the same function or different functions. The plurality of semiconductor chips may be stacked on the interposer 2100 and may be combined with each other via TSVs. The plurality of semiconductor chips may be electrically coupled though conductive interconnection lines disposed on and/or in the interposer 2100.

The semiconductor chip 2400 may be combined with the interposer 2100 using fourth connection members 2321 such as bumps (e.g., micro-bumps). The semiconductor chip 2400 may be electrically coupled to the first driver chip 2221. In addition, the first driver chip 2221 may receive electrical signals from the semiconductor chip 2400 to control the first optical transmitter 2231 so that the first optical transmitter 2231 generates the first optical signal 2211.

The first optical signal 2211 may be detected by the second optical receiver 2253 including a photo detector. In addition, the second driver chip 2223 may control the second optical receiver 2253 so that the second optical receiver 2253 converts the detected first optical signal 2211 into an electrical signal. The second driver chip 2223 may control the second optical transmitter 2233 so that the second optical transmitter 2233 including a light generating element generates the second optical signal 2213. The second optical signal 2213 may be detected by the first optical receiver 2251 including a photo detector. Further, the first driver chip 2221 may control the first optical receiver 2251 so that the first optical receiver 2251 converts the detected second optical signal 2213 into an electrical signal.

Figure 4:
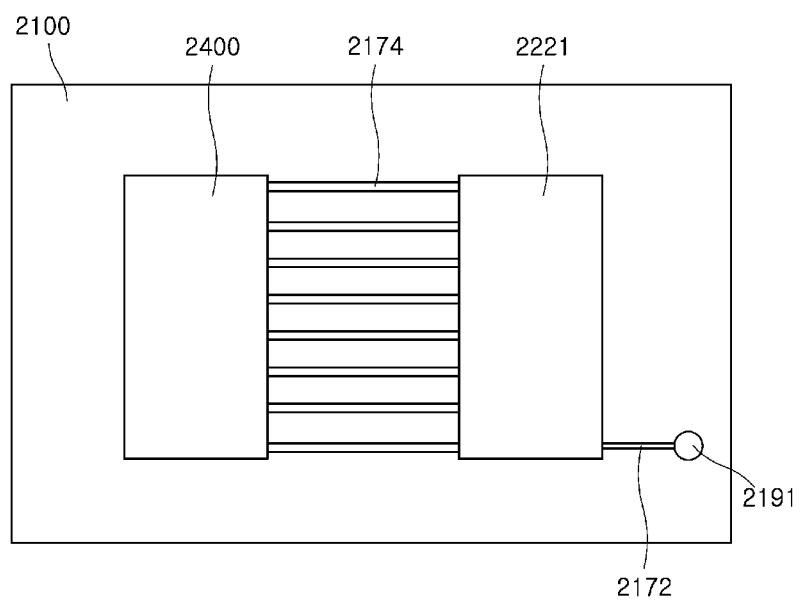
FIG. 4 is a plan view illustrating an electrical connection between a semiconductor chip and a driver chip included in a semiconductor package according to an embodiment.

The semiconductor chip 2400 and the first driver chip 2221 may electrically communicate with each other through first conductive interconnection lines 2174 disposed on and/or in the interposer 2100 to electrically couple the fourth connection members 2321 under the semiconductor chip 2400 to the first connection members 2320 under the first driver chip 2221 (see FIG. 4). The fourth connection members 2321 may be bumps such as micro-bumps. If the first and fourth connection members 2320 and 2321 are bumps, each of the fourth connection members 2321 may have the same size and shape as each of the first connection members 2320. Each of the first conductive interconnection lines 2174 may include a metal material.

Second connection members 2310 may be attached to the bottom surface 2103 of the interposer 2100. The second connection members 2310 may include a power supply terminal to supply a power supply voltage and a signal terminal to supply a data signal. The second connection members 2310 may be bumps such as C4 bumps. The second driver chip 2223 disposed on the bottom surface 2103 of the interposer 2100 may be electrically coupled to any one of the second connection members 2310. For example, a second conductive interconnection line 2175 disposed to be adjacent to the bottom surface 2103 of the interposer 2100 may electrically couple the second driver chip 2223 to one of the second connection members 2310.

The second driver chip 2223 disposed on the bottom surface 2103 of the interposer 2100 may be electrically coupled to another of the second connection members 2310. For example, a fourth conductive interconnection line 2173 disposed to be adjacent to the bottom surface 2103 of the interposer 2100 may electrically couple the second driver chip 2223 to another of the second connection members 2310. If the second connection member 2310 electrically coupled to the fourth conductive interconnection line 2173 act as a power supply terminal, the fourth conductive interconnection line 2173 may function as a power supply path between the power supply terminal and the second driver chip 2223. In such a case, the second conductive interconnection line 2175 and the second connection member 2310 electrically coupled to the second conductive interconnection line 2175 may function as an electrical data signal transmission path.

An electrical path to electrically couple the first driver chip 2221 to the second connection member 2310 used as the power supply terminal may include a third conductive interconnection line 2172 disposed to be adjacent to the top surface 2101 of the interposer 2100 and a first through via 2191 that penetrates the interposer 2100. In such an instance, an end of the third conductive interconnection line 2172 may be electrically coupled to an end of the first through via 2191. Accordingly, the power supply voltage may be supplied to the first driver chip 2221 through the electrical path including the third conductive interconnection line 2172 and the first through via 2191. In various embodiments, if the fourth conductive interconnection line 2173 is used as an electrical data signal transmission path, the third conductive interconnection line 2172 and the first through via 2191 may function as an electrical data signal transmission path. A signal terminal may be disposed on the bottom surface of the interposer 2100 and electrically coupled to an end of the first through via 2191.

An electrical path for electrically coupling the semiconductor chip 2400 to the second connection member 2310 used as the power supply terminal may include a fifth conductive interconnection line 2176 disposed to be adjacent to the top surface 2101 of the interposer 2100 and a second through via 2193 that penetrates the interposer 2100. In such a case, an end of the fifth conductive interconnection line 2176 may be electrically coupled to an end of the second through via 2193. As a result, the power supply voltage may be supplied to the semiconductor chip 2400 through the electrical path including the fifth conductive interconnection line 2176 and the second through via 2193. A signal terminal may be disposed on the bottom surface of the interposer 2100 and electrically coupled to an end of the second through via 2193.

In various embodiments, if the second connection member 2310 electrically coupled to the second through via 2193 is used as an electrical data signal terminal, electrical data signals may be transmitted to or outputted from the semiconductor chip 2400 through the electrical path including the fifth conductive interconnection line 2176 and the second through via 2193. If the first and second through vias 2191 and 2193 are used to supply the power supply voltage to the semiconductor chip 2400 and the first driver chip 2221 disposed on the top surface 2101 of the interposer 2100, additional through vias may be provided for transmission of data signals. The first and second through vias 2191 and 2193 and the additional through vias may constitute a plurality of through vias 2190.

Referring again to FIGS. 2 and 3, each of the first and second transceivers 2201 and 2203 may be configured to include a photonic device that converts electrical signals into optical signals to transmit the optical signals. The first and second receivers 2201 and 2203 also receive signals including optical signals to convert the optical signals into electrical signals. The photonic device may be, for example, an electrical-optical-electrical (E-O-E) transceiver 400 (see FIG. 3).

The E-O-E transceiver 400 may include a serializer/deserializer (SER/DES) 411 that arranges signals inputted thereto through a plurality of buses to reduce the number of optical paths. The serializer/deserializer (SER/DES) 411 may be included in a driver chip 410. Electrical signals outputted from the serializer/deserializer (SER/DES) 411 may be controlled by drivers 413 and may be converted into optical signals through a light source 431 and electro-optic modulators (E/O MODs) 433. The light source 431 and the electro-optic modulators (E/O MODs) 433 may constitute an optical device included in an optical transmitter 430. A lambda multiplexer (λ MUX) 435 and a circular polarizing light (CPL) filter 437 may be configured to be adjacent to an outlet of the optical transmitter 430. Further, optical signals generated from the lambda multiplexer (λ MUX) 435 and the circular polarizing light (CPL) filter 437 may be outputted through outlet of the optical transmitter 430. The electro-optic modulators (E/O MODs) 433, the light source 431, the lambda multiplexer (A MUX) 435 and the circular polarizing light (CPL) filter 437 may constitute the optical transmitter 430. The E-O-E transceiver 400 may further include an optical receiver 450. The optical receiver 450 may be an optical device that includes a circular polarizing light (CPL) filter 457, a lambda demultiplexer (λ DE-MUX) 455 and photo detectors (PDs) 453. Each of the photo detectors (PDs) 453 may convert optical signals into electrical signals. An operation of the lambda multiplexer (λ MUX) 435 may be controlled by a controller 417. In addition, the controller 417 may be included in the driver chip 410.

Trans-impedance amplifiers (TIA) 415 to amplify signals detected by the photo detectors (PDs) 453 and a controller 419 to control an operation of the lambda demultiplexer (λ DE-MUX) 455 may be included in the driver chip 410. Each of the first and second driver chips 2221 and 2223 illustrated in FIG. 2 may correspond to the driver chip 410 illustrated in FIG. 3. In addition, the driver chip 410 may be realized using a complementary metal-oxide-semiconductor (CMOS) circuit. The optical transmitter 2231 or 2223 illustrated in FIG. 2 may correspond to the optical transmitter 430 illustrated in FIG. 3. Further, the optical receiver 2251 or 2253 illustrated in FIG. 2 may correspond to the optical receiver 450 illustrated in FIG. 3.

Referring again to FIGS. 2 and 5, each of the fourth connection members 2321 for electrically coupling the semiconductor chip 2400 to the interposer 2100 may be a micro-bump having a first height H1 and a first width W1. The second connection members 2320 attached to the bottom surface 2103 of the interposer 2100 may be C4 bumps. In such a case, each of the second connection members 2320 may have a second height H2 greater than the first height H1 and a second width W2 greater than the first width W1.

Each of the fourth connection members 2321 may be attached to a first pad 2177 disposed on the top surface 2101 of the interposer 2100. In addition, each of the second connection members 2310 may be attached to a second pad 2179 disposed on the bottom surface 2103 of the interposer 2100. A width of the second pad 2179 may be greater than a width of the first pad 2177. In addition, a pitch of the second pad 2179 may also be greater than a pitch of the first pad 2177. The first and second pads 2177 and 2179 may correspond to conductive patterns. The interposer 2100 may include a silicon body 2110, a first dielectric layer 2130 disposed on a top surface of the silicon body 2110, and a second dielectric layer 2150 disposed on a bottom surface of the silicon body 2110. In such a case, the top surface 2101 of the interposer 2100 may correspond to a top surface of the first dielectric layer 2130 opposite to the silicon body 2110. In addition, the bottom surface 2103 of the interposer 2100 may correspond to a bottom surface of the second dielectric layer 2130 opposite to the silicon body 2110. The first pad 2177 may be electrically coupled to the second pad 2179 through an internal interconnection line 2178 penetrating the first dielectric layer 2130 to have a conductive via shape, a through via 2190 penetrating the silicon body 2110, and an internal interconnection line 2178 penetrating the second dielectric layer 2150 to have a conductive via shape. Moreover, a width and a pitch of the second pads 2179 are greater than the width and the pitch of the first pads 2177.

The conductive interconnection lines 2176 and 2172 disposed on the first dielectric layer 2130 may have a pitch (or a width) different from a pitch (or a width) of the other conductive interconnection lines 2173 and 2175 disposed on the second dielectric layer 2150. Accordingly, the semiconductor chip 2400 may be attached to the interposer 2100 using the fourth connection members 2321 such as micro-bumps. In addition, the second connection members 2310 may be realized using bumps larger than the fourth connection members 2321. Since the interposer 2100 includes the silicon body 2110, the interposer 2100 may be fabricated using a silicon wafer and semiconductor process technologies. Accordingly, the first pads 2177 may be formed to have fine patterns. In addition, the semiconductor chip 2400 may be electrically coupled to the first pads 2177 using micro-bumps as the fourth connection members 2321.

Referring once more to FIGS. 2 and 6, interconnection structures 2170 may be disposed in the first and second dielectric layers 2130 and 2150 respectively stacked on the top surface and the bottom surface of the silicon body 2110. The interconnection structures 2170 may be combined with the through vias (2190 of FIG. 5) penetrating the silicon body 2110 to provide electrical paths. In addition, the interconnection structures 2170 may also be combined with the first pads 2177 and the first conductive interconnection lines 2174 to provide electrical paths. A portion of the interposer 2100 may be defined as a light permeation portion 2105. In addition, the light permeation portion 2105 may be a transparent material through which the optical signals 2211 and 2213 pass. For example, the light permeation portion 2105 may be a glass material. If the interposer 2100 including the light permeation portion 2105 is a silicon material, infrared (IR) rays may be used as light of the optical signals 2211 and 2213 to obtain a relatively high permeability of the optical signals 2211 and 2213. This is because the IR rays have a property that penetrates the silicon body 2110 of the interposer 2100. In such an instance, it may be unnecessary to selectively form the light permeation portion 2105 with a transparent material. In various embodiments, the interposer 2100 may be a glass interposer that employs a glass body instead of the silicon body 2110. In such a case, visible rays or ultraviolet (UV) rays may also be used as light of the optical signals 2211 and 2213 because various rays having different wavelengths can penetrate the glass interposer. If the IR rays are used as light of the optical signals 2211 and 2213, the IR rays may have a wavelength of about 1200 nanometers to about 15000 nanometers. If the interposer 2100 is a silicon interposer, the IR rays used as light of the optical signals 2211 and 2213 may have a relatively short wavelength to reduce the propagation loss of the IR rays in the silicon interposer. For example, the IR rays having a wavelength of about 1310 nanometers, 1383 nanometers, 1550 nanometers, 1610 nanometers or 1625 nanometers may be used as the light of the optical signals. The IR rays having a wavelength of about 1310 nanometers, 1383 nanometers, 1550 nanometers, 1610 nanometers or 1625 nanometers may also exhibit low propagation loss even in a medium such as an optical fiber used in the optical communication.

Figure 7:
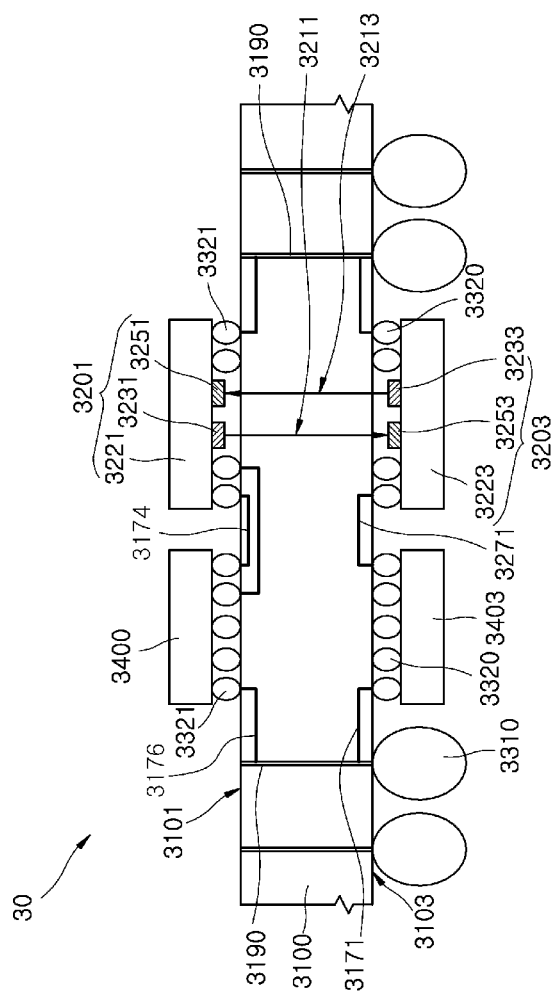
FIG. 7 is a cross-sectional view illustrating a semiconductor package according to yet an embodiment.

Referring to FIG. 7, a cross-sectional view illustrating a semiconductor package 30 according to an embodiment is described.

In FIG. 7, the semiconductor package 30 may include a first transceiver 3201 disposed on a top surface 3101 of an interposer 3100 and a second transceiver 3203 disposed on a bottom surface 3103 of the interposer 3100. Each of the first and second transceivers 3201 and 3203 may be a photonic device that converts electrical signals into optical signals to transmit the optical signals and receives an optical signal 3211 or 3213 to convert the optical signal 3211 or 3213 into an electrical signal.

A first driver chip 3221 may be disposed on the top surface 3101 of the interposer 3100. In addition, a second driver chip 3223 may be disposed on the bottom surface 3103 of the interposer 3100. The first and second driver chips 3221 and 3223 may be attached to the interposer 3100 using first connection members 3320 such as bumps (e.g., micro-bumps). The first and second driver chips 3221 and 3223 may be respectively disposed on both surfaces of a portion of the interposer 3100 to face each other. For example, the first and second driver chips 3221 and 3223 may be disposed to overlap with a portion of the interposer 3100 therebetween. A bottom surface of the first driver chip 3221 may face the top surface 3101 of the interposer 3100. In addition, a bottom surface of the second driver chip 3223 may face the bottom surface 3103 of the interposer 3100.

A first optical transmitter 3231 and a first optical receiver 3251 may be disposed on the bottom surface of the first driver chip 3221 and may be controlled by the first driver chip 3221. A second optical transmitter 3233 and a second optical receiver 3253 may be disposed on the bottom surface of the second driver chip 3223 and may be controlled by the second driver chip 3223. The first optical transmitter 3231, the first optical receiver 3251 and the first driver chip 3221 may constitute the first transceiver 3201. The second optical transmitter 3233, the second optical receiver 3253 and the second driver chip 3223 may constitute the second transceiver 3203. The second optical receiver 3253 may be disposed to be vertically aligned with the first optical transmitter 3231 so that the first optical signal 3211 generated from the first optical transmitter 3231 penetrates the interposer 3100 to directly travel toward the second optical receiver 3253. The second optical transmitter 3233 may be disposed to be vertically aligned with the first optical receiver 3251 so that the second optical signal 3213 generated from the second optical transmitter 3233 penetrates the interposer 3100 to directly travel toward the first optical receiver 3251.

A first semiconductor chip 3400, which is electrically coupled to the first driver chip 3221 through first conductive interconnection lines 3174, may be disposed on the top surface 3101 of the interposer 3100. In addition, a second semiconductor chip 3403, which is electrically coupled to the second driver chip 3223 through sixth conductive interconnection lines 3271, may be disposed on the bottom surface 3103 of the interposer 3100. The first and second semiconductor chips 3400 and 3403 may be combined with and electrically coupled to the interposer 3100 using fourth connection members 3321 such as micro-bumps. The first semiconductor chip 3400 may receive a power supply voltage through one (corresponding to a power supply terminal) of second connection members 3310 disposed on the bottom surface 3103 of the interposer 3100, one of through vias 3190 penetrating the interposer 3100, and one of fifth conductive interconnection lines 3176 disposed on the top surface 3101 of the interposer 3100. The second semiconductor chip 3403 may receive the power supply voltage through the power supply terminal among the second connection members 3310 disposed on the bottom surface 3103 of the interposer 3100 and one of seventh conductive interconnection lines 3171 disposed on the bottom surface 3103 of the interposer 3100.

The first and second semiconductor chips 3400 and 3403 may communicate with each other through optical signal paths provided by the first and second transceivers 3201 and 3203.

Figure 8:
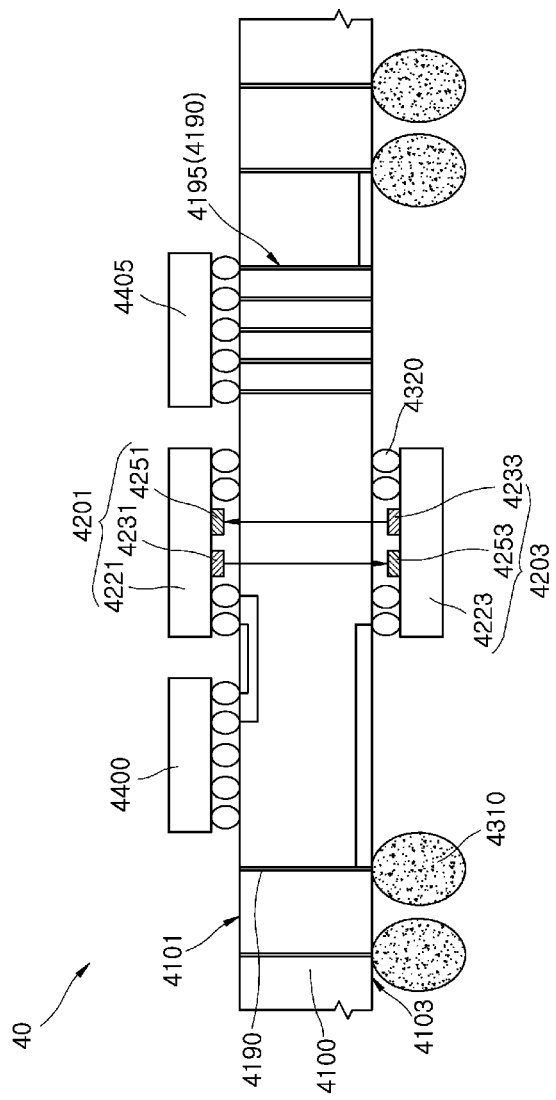
FIG. 8 is a cross-sectional view illustrating a semiconductor package according to still an embodiment.

Referring to FIG. 8, a cross-sectional view illustrating a semiconductor package 40 according to an embodiment is described.

In FIG. 8, the semiconductor package 40 may include a first transceiver 4201 disposed on a top surface 4101 of an interposer 4100 and a second transceiver 4203 disposed on a bottom surface 4103 of the interposer 4100. A first driver chip 4221 may be disposed on the top surface 4101 of the interposer 4100. In addition, a second driver chip 4223 may be disposed on the bottom surface 4103 of the interposer 4100. The first and second driver chips 4221 and 4223 may be attached to the interposer 4100 using first connection members 4320. The first and second driver chips 4221 and 4223 may be respectively disposed on both surfaces of a portion of the interposer 4100 to face each other. For instance, the first and second driver chips 4221 and 4223 may be disposed to overlap with a portion of the interposer 4100 therebetween. A bottom surface of the first driver chip 4221 may face the top surface 4101 of the interposer 4100. Further, a bottom surface of the second driver chip 4223 may face the bottom surface 4103 of the interposer 4100.

A first optical transmitter 4231 and a first optical receiver 4251 may be disposed on the bottom surface of the first driver chip 4221 and may be controlled by the first driver chip 4221. A second optical transmitter 4233 and a second optical receiver 4253 may be disposed on the bottom surface of the second driver chip 4223 and may be controlled by the second driver chip 4223. The first optical transmitter 4231, the first optical receiver 4251 and the first driver chip 4221 may constitute the first transceiver 4201. The second optical transmitter 4233, the second optical receiver 4253 and the second driver chip 4223 may constitute the second transceiver 4203. The second optical receiver 4253 may be disposed to be vertically aligned with the first optical transmitter 4231. In addition, the second optical transmitter 4233 may be disposed to be vertically aligned with the first optical receiver 4251.

A first semiconductor chip 4400, which is electrically coupled to the first driver chip 4221 through conductive interconnection lines, may be disposed on the top surface 4101 of the interposer 4100. A second semiconductor chip 4405 may be disposed on the top surface 4101 of the interposer 4100 to be separated from the first semiconductor chip 4400. The second semiconductor chip 4405 may be electrically coupled to at least one of second connection members 4310 disposed on the bottom surface 4103 of the interposer 4100 by through vias 4190 (e.g., third through vias 4195) penetrating the interposer 4100 and conductive interconnection lines disposed on the interposer 4100. The second connection members 4310 electrically coupled to the second semiconductor chip 4405 may include a power supply terminal to supply a power supply voltage to the second semiconductor chip 4405 and data signal terminals to transmit input/output (I/O) data. Signal paths in the semiconductor package 40 may include electrical paths and optical paths to improve an operation speed of the semiconductor package 40. In addition, since the semiconductor package 40 includes the optical paths, the number of the electrical paths may be reduced. Accordingly, the number of the chips disposed on the interposer 4100 in a limited area may increase to realize a large capacity of semiconductor package.

Figure 9:
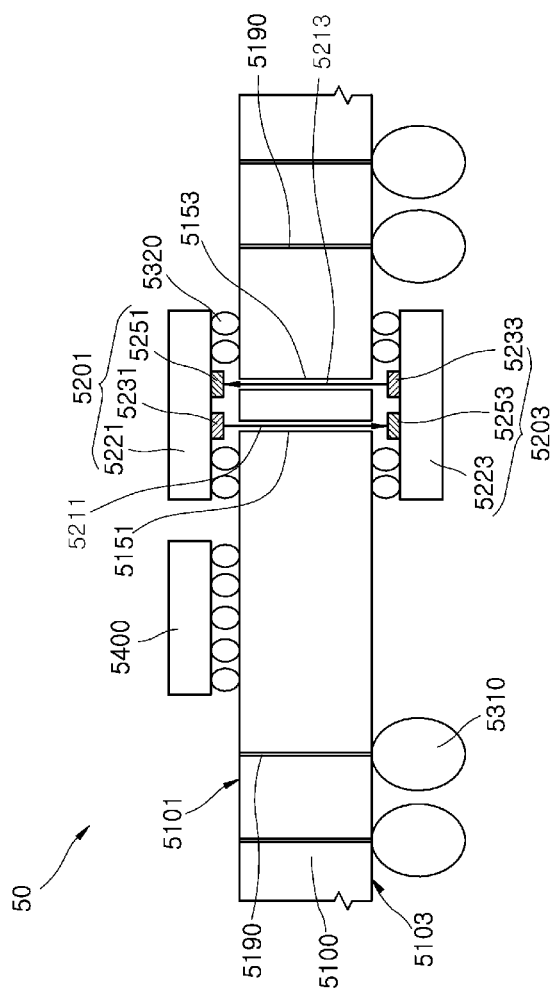
FIG. 9 is a cross-sectional view illustrating a semiconductor package according to yet still an embodiment.

Referring to FIG. 9, a cross-sectional view illustrating a semiconductor package 50 according to an embodiment is described.

In FIG. 9, the semiconductor package 50 may include a first transceiver 5201 disposed on a top surface 5101 of an interposer 5100 and a second transceiver 5203 disposed on a bottom surface 5103 of the interposer 5100. A first driver chip 5221 may be disposed on the top surface 5101 of the interposer 5100. In addition, a second driver chip 5223 may be disposed on the bottom surface 5103 of the interposer 5100. The first and second driver chips 5221 and 5223 may be attached to the interposer 5100 using first connection members 5320. The first and second driver chips 5221 and 5223 may be respectively disposed on both surfaces of a portion of the interposer 5100 to face each other. For example, the first and second driver chips 5221 and 5223 may be disposed to overlap with a portion of the interposer 5100 therebetween. A bottom surface of the first driver chip 5221 may face the top surface 5101 of the interposer 5100. Further, a bottom surface of the second driver chip 5223 may face the bottom surface 5103 of the interposer 5100.

A first optical transmitter 5231 and a first optical receiver 5251 may be disposed on the bottom surface of the first driver chip 5221 and may be controlled by the first driver chip 5221. A second optical transmitter 5233 and a second optical receiver 5253 may be disposed on the bottom surface of the second driver chip 5223 and may be controlled by the second driver chip 5223. The first optical transmitter 5231, the first optical receiver 5251 and the first driver chip 5221 may constitute the first transceiver 5201. The second optical transmitter 5233, the second optical receiver 5253 and the second driver chip 5223 may constitute the second transceiver 5203. The second optical receiver 5253 may be disposed to be vertically aligned with the first optical transmitter 5231. In addition, a first optical signal 5211 generated from the first optical transmitter 5231 may be transmitted to the second optical receiver 5253 via a first through hole 5151 vertically penetrating the interposer 5100. The first optical receiver 5251 may be disposed to be vertically aligned with the second optical transmitter 5233. Moreover, a second optical signal 5213 generated from the second optical transmitter 5233 may be transmitted to the first optical receiver 5251 via a second through hole 5153 vertically penetrating the interposer 5100.

The through holes 5151 and 5153 penetrating the interposer 5100 may act as optical paths through which the optical signals 5211 and 5213 travel. In such an instance, it may be unnecessary for the interposer 5100 to include a light permeation portion such as a transparent portion. A semiconductor chip 5400, which is electrically coupled to the first driver chip 5221 through conductive interconnection lines, may be disposed on the top surface 5101 of the interposer 5100. A plurality of through vias 5190 may be disposed to penetrate the interposer 5100. In addition, a plurality of connection members 5310 may be disposed on the bottom surface 5103 of the interposer 5100 to act as a power supply terminal and data signal terminals.

Figure 10:
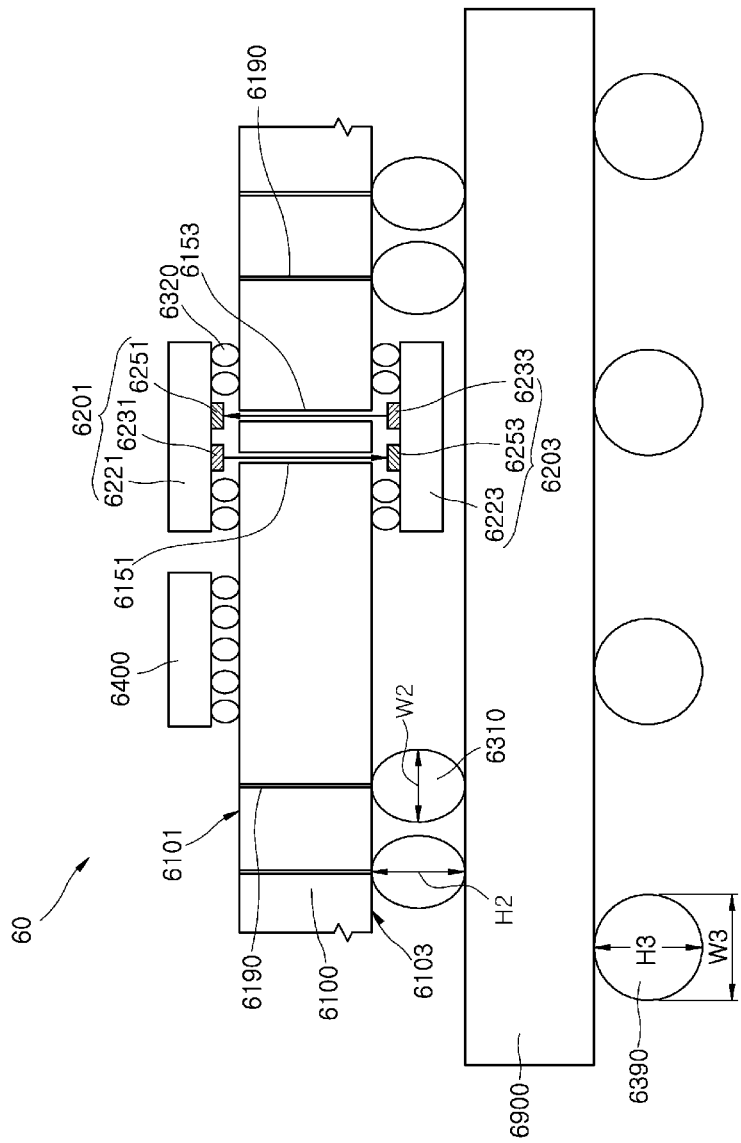
FIG. 10 is a cross-sectional view illustrating a semiconductor package according to an embodiment.

Referring to FIG. 10, a cross-sectional view illustrating a semiconductor package 60 according to an embodiment is described.

In FIG. 10, the semiconductor package 60 may include a first transceiver 6201 disposed on a top surface 6101 of an interposer 6100 and a second transceiver 6203 disposed on a bottom surface 6103 of the interposer 6100. A first driver chip 6221 may be disposed on the top surface 6101 of the interposer 6100. Further, a second driver chip 6223 may be disposed on the bottom surface 6103 of the interposer 6100. The first and second driver chips 6221 and 6223 may be attached to the interposer 6100 using first connection members 6320. The first and second driver chips 6221 and 6223 may be respectively disposed on both surfaces of a portion of the interposer 6100 to face each other. For example, the first and second driver chips 6221 and 6223 may be disposed to overlap with a portion of the interposer 6100 therebetween. A bottom surface of the first driver chip 6221 may face the top surface 6101 of the interposer 6100. In addition, a bottom surface of the second driver chip 6223 may face the bottom surface 6103 of the interposer 6100.

A first optical transmitter 6231 and a first optical receiver 6251 may be disposed on the bottom surface of the first driver chip 6221 and may be controlled by the first driver chip 6221. A second optical transmitter 6233 and a second optical receiver 6253 may be disposed on the bottom surface of the second driver chip 6223 and may be controlled by the second driver chip 6223. The first optical transmitter 6231, the first optical receiver 6251 and the first driver chip 6221 may constitute the first transceiver 6201. The second optical transmitter 6233, the second optical receiver 6253 and the second driver chip 6223 may constitute the second transceiver 6203. A first optical signal 6211 generated from the first optical transmitter 6231 may be transmitted to the second optical receiver 6253 via a first through hole 6151 vertically penetrating the interposer 6100. In addition, a second optical signal 6213 generated from the second optical transmitter 6233 may be transmitted to the first optical receiver 6251 via a second through hole 6153 vertically penetrating the interposer 6100. A semiconductor chip 6400, which is electrically coupled to the first driver chip 6221 through conductive interconnection lines, may be disposed on the top surface 6101 of the interposer 6100. In addition, a plurality of through vias 6190 may be disposed to penetrate the interposer 6100.

The bottom surface 6103 of the interposer 6100 may be combined with a package substrate 6900 using second connection members 6310, each of which has a second width W2 and a second height H2. The package substrate 6900 may be a printed circuit board (PCB) and may include conductive interconnection lines having a pitch and a line width greater than a pitch and a line width of conductive interconnection lines disposed on the interposer 6100. Third connection members 6390 may be attached to a bottom surface of the package substrate 6900 opposite to the interposer 6100. Each of the third connection members 6390 may include a solder ball or a bump. Each of the third connection members 6390 may have a third width W3 and a third height H3 greater than the second width W2 and the second height H2.

Figure 11:
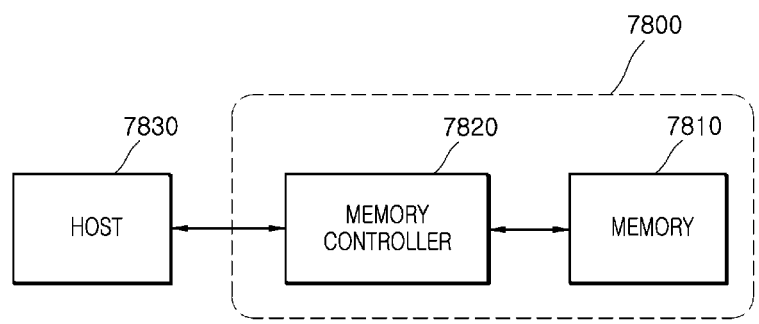
FIG. 11 is a block diagram illustrating an electronic system employing a memory card that includes at least one of semiconductor packages according to some embodiments.

Referring to FIG. 11, a block diagram illustrating an electronic system employing a memory card 7800 that includes at least one of semiconductor packages according to various embodiments is described. The memory card 7800 includes a memory 7810 such as a nonvolatile memory device, and a memory controller 7820. The memory 7810 and the memory controller 7820 may store data or read stored data. The memory 7810 and/or the memory controller 7820 include one or more semiconductor packages according to various embodiments.

The memory 7810 may include a nonvolatile memory package to which the technology of the embodiments of the invention is applied. The memory controller 7820 may control the memory 7810 such that stored data is read out or data is stored in response to a read/write request from a host 7830.

Figure 12:
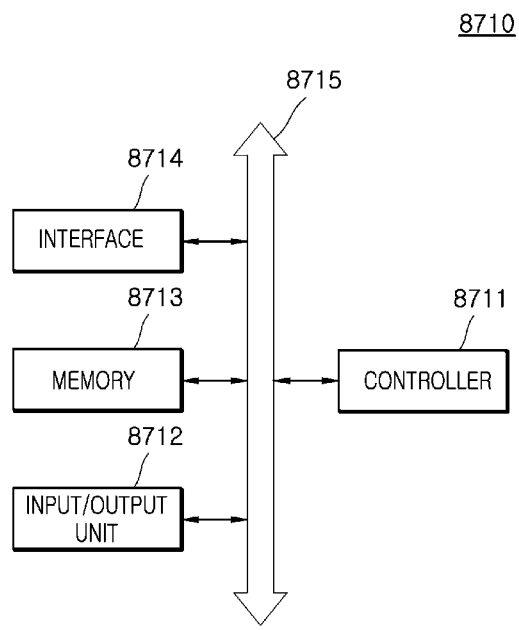
FIG. 12 is a block diagram illustrating another electronic system including at least one of semiconductor packages according to some embodiments.

Referring to FIG. 12, a block diagram illustrating an electronic system 8710 including at least one of semiconductor packages according to various embodiments is described. The electronic system 8710 may include a controller 8711, an input/output device 8712, and a memory 8713. The controller 8711, the input/output device 8712 and the memory 8713 may be electrically coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the invention. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

If the electronic system 8710 is an equipment capable of performing wireless communication, the electronic system 8710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

Embodiments of the invention have been disclosed for illustrative purposes. Those skilled in the art will appreciate that various modifications, additions and substitutions are possible without departing from the scope and spirit of the invention and the accompanying claims.

What is claimed is:

1. A semiconductor package comprising:
a semiconductor chip disposed on a top surface of an interposer;
a first driver chip disposed on the top surface and a second driver chip disposed on a bottom surface of the interposer respectively, the first driver chip and the semiconductor chip disposed on a same plane along the top surface of the interposer;
a first optical transmitter and a first optical receiver mounted on a surface of the first driver chip and controlled by the first driver chip; and
a second optical transmitter and a second optical receiver mounted on a surface of the second driver chip and controlled by the second driver chip,
wherein the second optical transmitter and the second optical receiver optically communicate with the first optical transmitter and the first optical receiver through optical signals that permeate the interposer, and
wherein the interposer further includes
a first conductive interconnection line electrically coupling the semiconductor chip to the first driver chip and disposed in a portion adjacent to the top surface of the interposer;
a signal terminal disposed on the bottom surface of the interposer; and
a second conductive interconnection line electrically coupling the second driver chip to the signal terminal and disposed in a portion adjacent to the bottom surface of the interposer.

2. The semiconductor package of claim 1, wherein the first and second driver chips are disposed to overlap with a portion of the interposer to face each other.

3. The semiconductor package of claim 2, wherein the first optical transmitter and the first optical receiver are mounted on a surface of the first driver chip that faces the second driver chip.

4. The semiconductor package of claim 3,
wherein the second optical receiver is mounted on a surface of the second driver chip that faces the first driver chip and is aligned with the first optical transmitter so that a first optical signal generated from the first optical transmitter permeates the interposer to reach the second optical receiver; and
wherein the second optical transmitter is mounted on a surface of the second driver chip that faces the first driver chip and is aligned with the first optical receiver so that a second optical signal generated from the second optical transmitter permeates the interposer to reach the first optical receiver.

5. The semiconductor package of claim 4, wherein the interposer includes a transparent light permeation portion through which the first and second optical signals pass.

6. The semiconductor package of claim 4, wherein the interposer includes a silicon material wherein the first and second optical signals pass.

7. The semiconductor package of claim 6, wherein the first and second optical signals are infrared (IR) rays.

8. The semiconductor package of claim 7, wherein the first and second optical signals have a wavelength of 1200 nanometers to 15000 nanometers.

9. The semiconductor package of claim 4, wherein the first and second optical signals are transmitted via through holes that penetrate the interposer.

10. The semiconductor package of claim 1, wherein the semiconductor chip includes a memory chip, a central processing unit (CPU) chip, a system large-scale integration (LSI) chip, or a field programmable gate array (FPGA) chip.

11. The semiconductor package of claim 1, wherein the first optical transmitter includes a laser device and the first optical receiver includes a photo detector.

12. The semiconductor package of claim 11,
wherein the first driver chip controls the laser device so that the laser device converts an electrical signal outputted from the semiconductor chip into one of the optical signals; or
wherein the first driver chip controls the photo detector to convert the another one of the optical signals into an electrical signal and to transmit the electrical signal to the semiconductor chip.

13. The semiconductor package of claim 1, further comprising:
a first through via penetrating the interposer; and
a third conductive interconnection line disposed on the top surface of the interposer to electrically couple one end of the first through via to the first driver chip.

14. The semiconductor package of claim 13, further comprising:
a power supply terminal disposed on the bottom surface of the interposer and electrically coupled to an other end of the first through via.

15. The semiconductor package of claim 14, further comprising:
a fourth conductive interconnection line disposed on the bottom surface of the interposer to electrically couple the power supply terminal to the second driver chip.

16. The semiconductor package of claim 13, further comprising:
another signal terminal disposed on the bottom surface of the interposer and electrically coupled to the other end of the first through via.

17. The semiconductor package of claim 15, further comprising:
a second through via penetrating the interposer; and
a fifth conductive interconnection line disposed on the top surface of the interposer to electrically couple one end of the second through via to the semiconductor chip.

* * * * *